United States Patent
Quiter et al.

(10) Patent No.: US 7,626,398 B2
(45) Date of Patent: Dec. 1, 2009

(54) SYSTEM FOR ISOLATING FAULTS BETWEEN ELECTRICAL EQUIPMENT

(75) Inventors: John Quiter, Bayville, NJ (US); Russell A. Shannon, Mt. Holly, NJ (US); Anthony J. D'Annunzio, Trenton, NJ (US); Megan C. Casey, Nashville, TN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 263 days.

(21) Appl. No.: 11/973,986

(22) Filed: Sep. 21, 2007

(65) Prior Publication Data

US 2009/0079437 A1    Mar. 26, 2009

(51) Int. Cl.
*G01R 31/08* (2006.01)
(52) U.S. Cl. .................. 324/527; 324/555; 324/73.1
(58) Field of Classification Search ........... 324/555, 324/556, 527, 73.1
See application file for complete search history.

(56) References Cited

U.S. PATENT DOCUMENTS

| 4,807,161 | A | * | 2/1989 | Comfort et al. | ............ 702/121 |
| 5,223,788 | A | * | 6/1993 | Andreano et al. | ............ 714/25 |
| 5,903,146 | A | * | 5/1999 | Wang | ...................... 324/158.1 |

* cited by examiner

*Primary Examiner*—Vincent Q Nguyen
(74) *Attorney, Agent, or Firm*—Mark O. Glut

(57) ABSTRACT

A system is disclosed that can be inserted between cable runs of electrical equipment so as to provide access to signal/data lines associated with the electrical equipment. The system includes a microprocessor and a matrix switch and preferably display equipment and measurement instrumentation. The microprocessor controls the matrix switch so as to route signals to a high impedance probe array that then feeds data to measurement instrumentation. The system provides pattern analyzers, which are resident in the microprocessor routine software. The measurement instrument provides measurement quantities, timing, and patterns that may be compared to known good data to ascertain the state of the health of the electrical equipment. The system is also capable of blocking signal paths and providing known good signals to the associated electrical equipment. Test data is stored in memory for later retrieval and the display equipment provides a pass, fail or intermittent indication.

1 Claim, 3 Drawing Sheets

US 7,626,398 B2

SYSTEM FOR ISOLATING FAULTS BETWEEN ELECTRICAL EQUIPMENT

The invention described herein was made in the performance of official duties by employees of the Department of the Navy and may be manufactured, used, licensed by or for the Government for any governmental purpose without payment of any royalties thereon.

FIELD OF THE INVENTION

The invention described herein relates to a system for isolating faults between electrical equipment and is particularly suited for isolating intermittent faults.

BACKGROUND OF THE INVENTION

Electrical equipment aboard aircraft when subjected to harsh operational conditions frequently fail or break down. Such electrical equipment may have electronic equipment containing circuit cards and are commonly referred to as "weapon replaceable assemblies," or WRAs. Typically, there are many WRAs within an aircraft and each is designed to be removed and replaced easily. However, narrowing a fault to a single WRA can be a time-consuming, labor-intensive, and often a very frustrating and costly process.

Frequently, in order to isolate a fault to a single WRA, a built-in-test (BIT) is performed which serves well its intended purpose. However, some aircraft have no BIT at all or even on aircraft with sophisticated BIT systems, locating the sources of intermittent faults (those faults not repeating regularly), as well as, false alarms can be a very difficult process.

The WRAs are connected by large bundles of wires, some bundles containing hundreds of wires. Currently, there is no known way to examine the electrical signals on these bundles while the WRAs are still in operation. It is desired to provide a system that allows for isolating faults between WRAs, while the WRAs are operational. Further, it is desired to provide a system that could be used to break diagnostic ambiguities between WRAs within an aircraft.

SUMMARY OF THE INVENTION

Accordingly, it is an object of the present invention to provide a system that facilitates the isolation of faults between operational electrical equipment and is particularly suited to isolate intermittent faults.

It is a further object of the present invention to provide a system for extracting or injecting an electrical signal from or into one or more bundles of electrical wires interconnecting electrical equipment.

It is another object of the present invention to provide a system having an indication of the health of the electrical signal being monitored.

It is a further object of the present invention to provide a system that compares electrical signals extracted from the one or more bundles of electrical wires interconnecting the electrical equipment against known data to ascertain the health of the associated electrical equipment.

In one embodiment, the system is used for isolating faults associated with one or more electronic assemblies interconnected to each other by a bundle of separated electrical wires, wherein each of the separated wire is terminated in a pin of at least one connector. The system comprises; a) an adaptor having an acceptor or means for accepting each of the connectors. This means further comprising terminals that are connected to pins of the connectors. The system further comprises; b) a signal generator providing an output; and c) a selector having an output and an input connected to receive the output of the signal generator. The selector has electronic switching for selectively and separately connecting its output to the terminals of the means for accepting the at least one connector.

BRIEF DESCRIPTION OF THE DRAWINGS

The foregoing objects and other advantages of the present invention will be more fully understood from the following detailed description in reference to the appended drawings wherein.

DETAILED DESCRIPTION OF THE INVENTION

Figure 1:
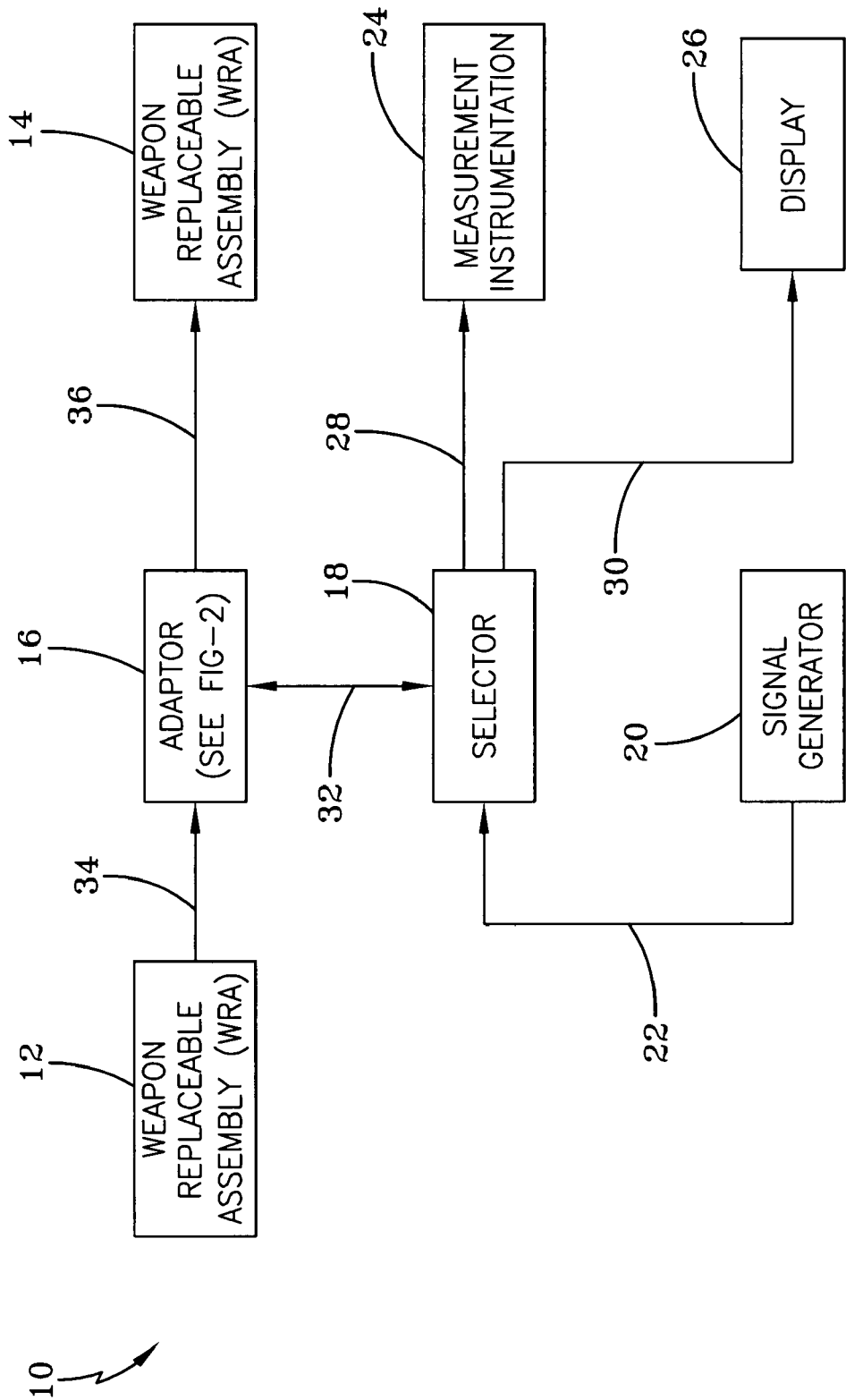
FIG. 1 is a block diagram of a system 10 of the present invention used for isolating faults between weapons replacement assemblies and which is particularly suited for isolating intermittent faults therebetween.

With reference to the drawings, FIG. 1 is a block diagram of a System 10 used for isolating faults associated with one or more electronic assemblies shown in FIG. 1 as comprising Weapon Replaceable Assemblies 12 and 14 and is particularly suited for isolation intermittent faults thereof. The System 10 provides for fault isolation between Weapon Replaceable Assemblies 12 and 14.

The System 10 comprises an Adaptor 16, a Selector 18, and a Signal Generator 20. The Signal Generator 20 has an output that is routed to the Selector 18, via signal path 22. As will be further described, the Signal Generator 20 is programmed by a microprocessor to output signals for insertion into the Adaptor 16. The System 10 preferably further comprises Measurement Instrumentation 24 and Display Equipment 26 respectively interconnected to the Selector 18 by signal paths 28 and 30.

The Measurement Instrumentation 24 may be comprised of test equipment that may vary dependent upon different requirements. For example, the Measurement Instrumentation 24 may comprise an oscilloscope, a digital multimeter, a signal processor, as well as software defined for a measurement system for controlling the generation of virtual instrumentation.

Figure 2:
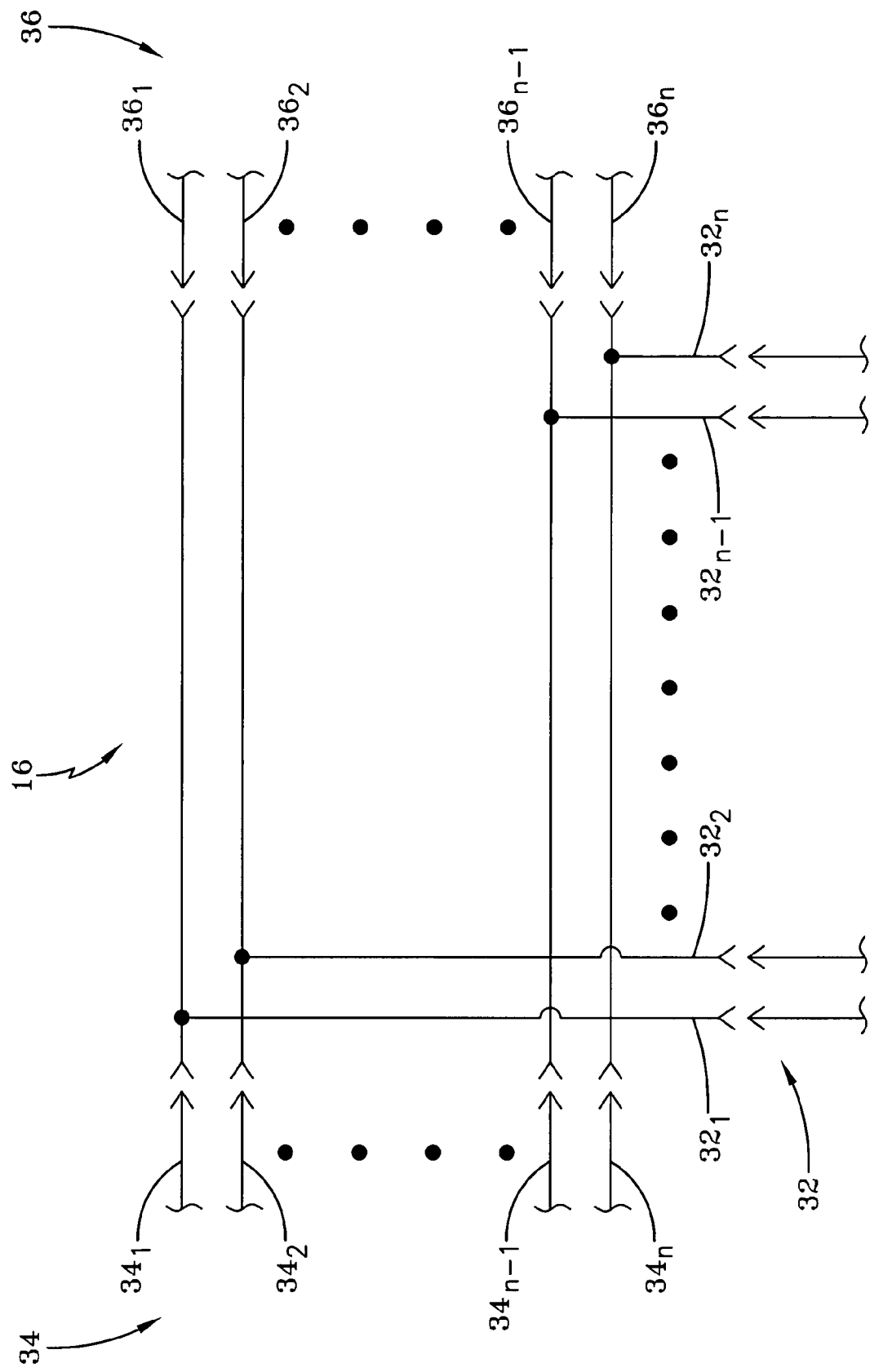
FIG. 2 illustrates further details of the adaptor 16 of FIG. 1.

The Display Equipment 26 may include indications of a status of the function being tested by System 10 and may be comprised of one or more light emitting diodes of different colors, so as to indicate the status of the result of the test being conducted by the System 10. Similarly, the Display Equipment 26 may be comprised of a liquid crystal display. The System 10 may be further described with reference to FIG. 2 illustrating further details of the Adaptor 16 having signal paths 32, 34, and 36.

The Adaptor 16 allows for hard wire connections of the Weapon Replaceable Assemblies 12 and 14 to be interfaced to the System 10, more particularly, to the Selector 18 of the System 10 by way of signal path 32. The Weapon Replaceable Assemblies 12 and 14 are interconnected to each other by a bundle of separated wires each of which is terminated in a pin or terminal of at least one connector. More particularly, as shown in FIG. 2, the Weapon Replaceable Assembly 12 is interconnected to the Adaptor 16, by way of a cable 34 having pins or terminals $34_1, 34_2, \ldots 34_{N-1}$ and $34_N$. Similarly, the Weapon Replaceable Assembly 14 is interconnected to the Adaptor 16, by a bundle of separated wires each of which is terminated in a pin or terminal of a connector 36 having pins $36_1, 36_2, \ldots 36_{N-1}$ and $36_N$. The Adaptor 16 is provided with a connector 32, which respectively accepts each of the connectors 34 and 36 having pins $34_1, 34_2, \ldots 34_{N-1}$ and $34_N$ and $36_1, 36_2, \ldots 36_{N-1}$ and $36_N$, and which are respectively connected to pins or terminals $32_1, 32_2, \ldots 32_{N-1}$ and $32_N$. The System 10 may be further described with reference to FIG. 3.

Figure 3:
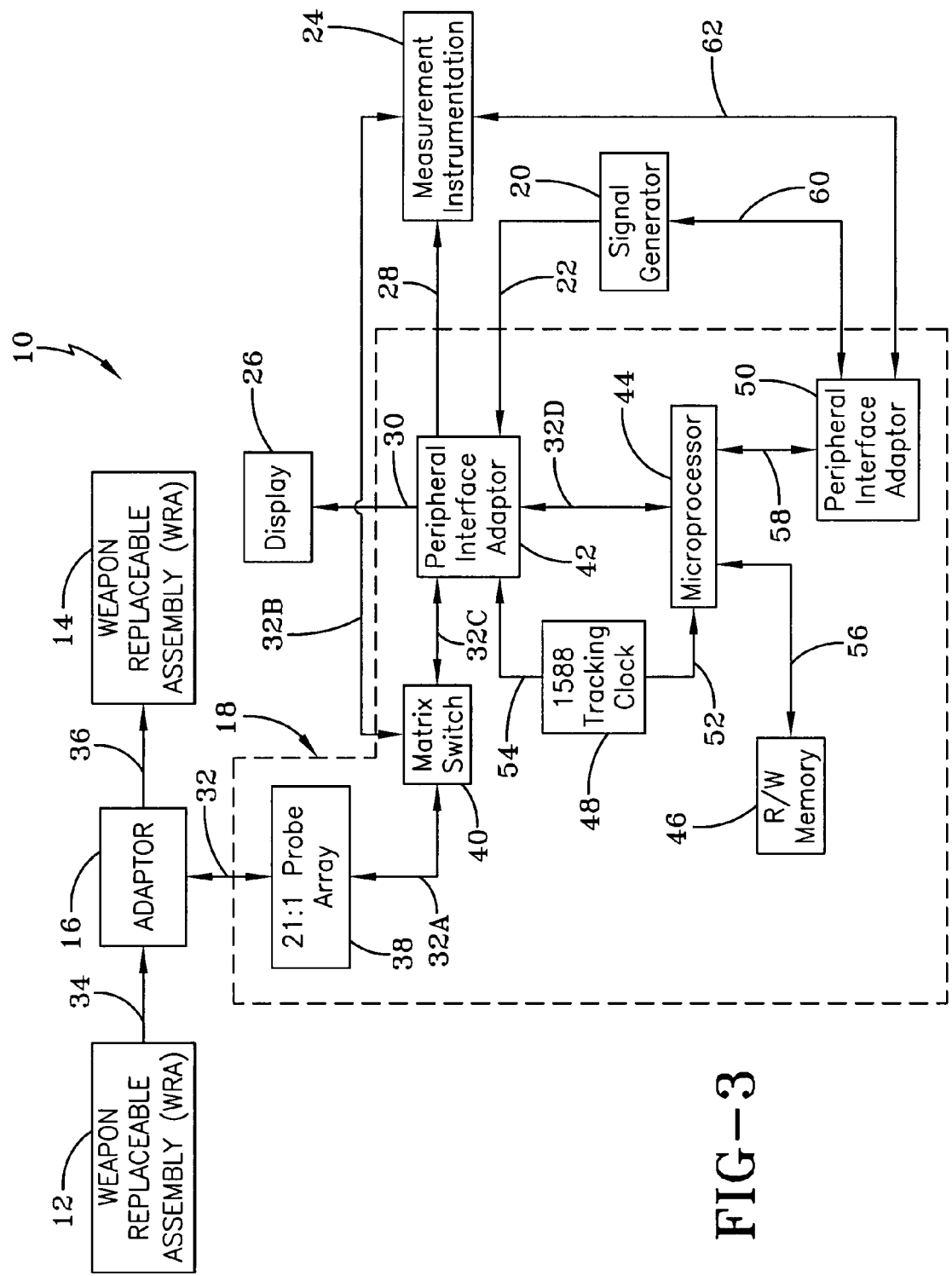
FIG. 3 is a block diagram illustrating further details of the system 10 of FIG. 1.

FIG. 3 shows all of the elements of FIG. 1, but in addition thereto, shows that the Selector 18 is comprised of a 21:1 Probe Array 38, a Matrix Switch 40, a first Peripheral Interface Adaptor 42, a Microprocessor 44, a Read/Write (R/W) Memory 46, a 1588 Tracking Clock 48, and a second Peripheral Interface Adaptor 50.

In general, the System 10 provides bidirectional multiplexer (data selector)/demultiplexer (data distributor) capability for handling both analog and digital data lines. As will be further discussed, the System 10 digitally controls which signal pathways of the Weapon Replaceable Assemblies 12 and 14 are open and which are closed to signal transmission. The System 10 is preferably provided to enable access to one or more data lines, to insert signals onto one or more data lines of the Weapon Replaceable Assemblies 12 and 14, and to provide this data for comparison to known good data. Pattern recognition (e.g., signal rise/fall/dwell times, signal strength/values, signal timing, etc.) are performed by System 10 and comparisons are made with known good patterns. Pass/fail/intermittent status is displayed on the Display Equipment 26 as a result of continuous testing of the initiated test. The System 10 may be configured to be used with automatic test equipment (ATE) or may be packaged to be placed in situ. Power to energize the System 10 may be provided by an onboard battery or from the Weapon Replaceable Assembly 12 or 14 being tested.

The 21:1 Probe Array 38 of the Selector 18, wherein the ratio 21:1 signifies that the signal is attenuated by a factor of 21, is known in the art and is commercially available. These 21:1 probes have minimal loading effects on the data lines of the Weapon Replaceable Assemblies 12 and 14 under test because of their low Q factor while still having a fast rise time. The 21:1 Probe Array 38 is primarily used to sample signal data. The 21:1 Probe Array 38 is selected to have a predetermined number of contacts (data lines) which are addressable (e.g. 64 data lines addressed by 64 separate probes) or a smaller number of array banks internally switched to address only the data lines of interest.

The 21:1 Probe Array 38 is bidirectional in operation, so as to accommodate both data sampling and data insertion. The bidirectional path of the 21:1 Probe Array 38 is shown in FIG. 3 by the use of reference designation 32A, which is operatively cooperative with and associated with transmission path 32, transmission path 32B between the Matrix Switch 40 and the Measurement Instrumentation 24, transmission path 32C between Matrix Switch 40 and the first Peripheral Interface Adaptor 42, and transmission path 32D between the Microprocessor 44 and the first Peripheral Interface Adaptor 42.

The Matrix Switch 40 is known in the art and is commercially available. The number of contacts (data lines) of the 21:1 Probe Array 38 determines the matrix size of the Matrix Switch 40 (e.g. 64 contacts (data lines) requires and 8-by-8 matrix switch). The Matrix Switch 40 is controlled by the Microprocessor 44 by way of the first Peripheral Interface Adaptor 42. Drivers (a pull-up resistor or a driver transistor) can be used to protect the Peripheral Interface Adaptor 42 output pins, shown by reference designator 32C, from electrical transients, static electricity, or other damaging events.

The first Peripheral Interface Adaptor 42 is known in the art and is commercially available. The first Peripheral Interface Adaptor 42, as well as the second Peripheral Interface Adaptor 50, may be a MC6821 type or equivalent thereof. The first Peripheral Interface Adaptor 42 interfaces, via signal path 32D, with the Microprocessor 44 (or Microcontroller) by way of an 8-bit bidirectional data bus, three chip select lines, two register select lines, two interrupt request lines, a read/write line, an enable line, and a reset line. The number of first Peripheral Interface Adaptors 42 used is determined by the number of contacts (data lines) associated with connector 32 (see FIG. 2) required. The first Peripheral Interface Adaptor 42 also controls the Display Equipment 26, via signal path 30.

The Display Equipment 26 may be, as previously mentioned, comprised of light emitting diodes (LEDs) or a small liquid crystal display capable of displaying hexadecimal characters generated by the Microprocessor 44 and delivered to the Display Equipment 26, by way of the first Peripheral Interface Adaptor 42 and signal path 30.

The Microprocessor 44 is provided with Read/Write (R/W) Memory 46. The Read/Write (R/W) Memory 46 stores data used by the Microprocessor 44. Physically, the R/W Memory 46 may be either a Dynamic Random Access Memory (DRAM) or a non-volatile flash memory. Non-volatile memory or read only memory (ROM) may store known-good patterns used in pattern recognition processing for testing the Weapon Replaceable Assemblies 12 and 14 in a manner to be further described.

The Microprocessor 44 is also provided with a 1588 Tracking Clock 48, which is a common system clock that feeds the Microprocessor 44, via signal path 52, the first Peripheral Interface Adaptor 42, via signal path 54, and any other components (not shown) that may require a clock signal to operate. The 1588 Tracking Clock 48 is known in the art and may also be used to synchronize the System 10 with any incoming clock signal associated with Weapon Replaceable Assemblies 12 and 14 by using an IEEE-1588 Clock Synchronization Protocol.

The Microprocessor 44 operates as the control processing unit of the System 10. One embodiment of System 10 may be implemented by using a Motorola 68HC11 microprocessor or an equivalent microprocessor or microcontroller. The Microprocessor 44 communicates with the Signal Generator 20, via the second Peripheral Interface Adaptor 50 and bidirectional signal paths 58 and 60. Similarly, the Microprocessor 44 communicates with the Measurement Instrumentation 24, via the second Peripheral Interface Adaptor 50 and bidirectional signal path 62. The Microprocessor 44 communicates with the rest of the System 10 through the first Peripheral Interface Adaptor 42, with the exception of the R/W Memory 46. More particularly, the Microprocessor 44 communicates with the R/W Memory 46 directly, via signal path 56. The Microprocessor 44 uses the 1588 Tracking Clock 46 as the system clock signal. The Microprocessor 44 does all data processing necessary in order to realize pattern recognition and to determine the status of the Weapons Replaceable Assembly 12 or 14 under test. In one embodiment, the Microprocessor 44 compares input from the first Peripheral Interface Adaptor 42 with known good patterns stored in the R/W Memory 46.

In operation, and with reference to FIG. 3, the System 10, more particularly the Microprocessor 44, is programmed to operate in several modes, such as three. In the first mode, the System 10 is not electrically connected to the data lines under test, allowing normal operation of those data lines and, thus normal operation of the Weapon Replaceable Assemblies 12 and 14. In the second mode, the System 10 is electrically connected to the data lines under test and measures and analyzes the signals passing along the data lines between the Weapon Replaceable Assemblies 12 and 14. The status of the testing to which Weapon Replaceable Assembly 12 and/or 14 is subjected is outputted to the Display Equipment 26, via the Microprocessor 44 (signal path 32D), the first Peripheral Interface Adaptor 42 and signal path 30. In the third mode, the System 10 is electrically connected to the data lines under test and isolates the incoming data lines to allow the System 10 to inject test signals on to the data lines between the Weapon Replaceable Assemblies 12 and 14.

The Microprocessor 44, in one embodiment, performs the complete series of operations, determined by resident routines, that controls all the three modes of operation of the System 10. The Microprocessor 44, in one embodiment, generates first, second, third and fourth control signals. The first control signal electronically connects the first Peripheral Interface Adaptor 42 to the Matrix Switch 40, via signal paths 32D and 32C. The second control signal electronically connects the first Peripheral Interface Adaptor 42 to the Display Equipment 26, via signal paths 32D and 30. The third control signal electronically connects the first Peripheral Interface Adaptor 42 to the Signal Generator 20, via signal paths 32D and 22 and also electronically connects the second Peripheral Interface Adaptor 50 to the Signal Generator 20, via signal paths 58 and 60. The fourth control signal electronically connects the first Peripheral Interface Adaptor 42 to the Measurement Instrumentation 24, via signal paths 32D and 28 and also connects the second Peripheral Interface Adaptor 52 to the Measurement Instrumentation 24, via signal paths 58 and 62. The Microprocessor 44 in the first mode of operation does not generate a first, second, third or fourth control signal, via signal path 32D, thereby not activating the Peripheral Interface Adaptors 42 and 50 and the Matrix Switch 40.

The Microprocessor 44, in the second mode, generates the first, second and fourth control signals, thereby activating the Peripheral Interface Adaptors 42 and 50 and the Matrix Switch 40. The Microprocessor 44 in response to its resident routines receives the signals passing between the Weapon Replaceable Assemblies 12 and 14, and then measures or compares the received signal against known quantities, and analyzes these associated signals. The Microprocessor 44 analyzes the associated signals and the status of the results thereof is routed to the Display Equipment 26.

The Microprocessor 44, in the third mode, also generates the first, second and fourth control signals, via signal path 32D, as in the second mode, but in addition thereto activates the Signal Generator 20, via the third control signal which, in turn, generates signals, via signal path 22, associated with the third mode that are interjected onto the data lines between the Weapon Replaceable Assemblies 12 and 14.

The routines residing in the Microprocessor 44 for the second and third modes of operation are dependent upon the requirements of the signals exchanged between the Weapon Replaceable Assemblies 12 and 14 and are derived in a manner known in the art.

It should now be appreciated that the System 10, when interposed between Weapon Replaceable Assemblies 12 and 14, facilitates the isolation of faults and is particularly suited to isolate intermittent faults, because the signals associated with the Weapon Replaceable Assemblies 12 and 14 may be probed and tested, while the Weapon Replaceable Assemblies 12 and 14 are in their operational state generating active signals.

It should be further appreciated that the System 10 of the present invention provides for extracting or injecting electrical signals from or into one or more bundles of electrical wires interconnecting electrical equipment, such as the Weapon Replaceable Assemblies 12 and 14.

It should still be further appreciated that the System 10 of the present invention displays the electrical signals being extracted or injected from or into the one or more bundles of electrical wires interconnecting the Weapon Replaceable Assemblies 12 and 14.

Furthermore, it should be appreciated that the present invention provides for the ability to compare electrical signals extracted from the one or more bundles of electrical wires interconnecting the electrical equipment against known signals to ascertain the health of the associated equipment.

Although the invention has been described to specific embodiments thereof related to particular electrical equipment, there are more variations or modifications that will be readily apparent through those skilled in the art following the teaching given herein. It is therefore understood that, within the scope of independent claims attached hereto, the invention may be practiced other than as specifically described.

What we claim is:

1. A system for isolating faults associated with one or more electronic assemblies interconnected to each other by a bundle of separated electrical wires each of which is terminated in a pin of at least one connector, said system comprising;

an adaptor having an acceptor for each of said connectors, said acceptor further comprising terminals that are connected to said pins of said connectors;

a signal generator providing an output; and a selector having an output and an input connected to receive said output of said signal generator, said selector having electronic switching for selectively and separately connecting its output to said terminals of said acceptor, said selector further comprises:

an array of probes of a first predetermined number electronically connected to said terminals of said acceptors;

a matrix switch having contacts of a second predetermined number equal to said first predetermined number of said array of probes and electronically connected thereto;

a first peripheral interface adaptor responsive to a first control signal for electronically connecting to said contacts of said matrix switch and being responsive to a second control signal for electronically connecting to display equipment;

a second peripheral adaptor responsive to a third control signal for electronically connecting to a signal generator and being responsive to a fourth control signal for electronically connecting to measurement instrumentation; said third and fourth control signals also respectively connecting said first peripheral adaptor to said signal generator and to said measurement instrumentation; and a microprocessor generating said first, second, third and fourth control signals and having an output comprising said output of said selector.

* * * * *